United States Patent
Yoo et al.

(10) Patent No.: US 9,876,042 B2
(45) Date of Patent: Jan. 23, 2018

(54) IMAGE SENSOR HAVING VERTICAL TRANSFER GATE AND METHOD FOR FABRICATING THE SAME

(71) Applicant: SK hynix Inc., Gyeonggi-do (KR)

(72) Inventors: Kyung-Dong Yoo, Gyeonggi-do (KR); Sun-Ha Hwang, Gyeonggi-do (KR); Sung-Bo Hwang, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 16 days.

(21) Appl. No.: 14/855,160

(22) Filed: Sep. 15, 2015

(65) Prior Publication Data
US 2016/0365375 A1 Dec. 15, 2016

(30) Foreign Application Priority Data
Jun. 9, 2015 (KR) .................. 10-2015-0080993

(51) Int. Cl.
*H01L 29/04* (2006.01)
*H01L 27/148* (2006.01)
*H01L 27/146* (2006.01)

(52) U.S. Cl.
CPC .... *H01L 27/14614* (2013.01); *H01L 27/1464* (2013.01); *H01L 27/1469* (2013.01); *H01L 27/14634* (2013.01); *H01L 27/14621* (2013.01); *H01L 27/14627* (2013.01)

(58) Field of Classification Search
CPC ........... H01L 27/14614; H01L 27/1464; H01L 27/14634; H01L 27/1469; H01L 27/14627; H01L 27/14621
See application file for complete search history.

(56) References Cited

U.S. PATENT DOCUMENTS

| 8,748,945 B2 | 6/2014 | Shin |
| 8,773,562 B1 | 7/2014 | Fan |
| 9,515,116 B1 * | 12/2016 | Sze ...................... H01L 27/1464 |
| 2007/0052056 A1 * | 3/2007 | Doi ...................... H01L 27/1463 257/462 |
| 2007/0069258 A1 * | 3/2007 | Ahn .................. H01L 27/14634 257/290 |
| 2007/0278606 A1 * | 12/2007 | Sasagawa ......... H01L 27/14643 257/432 |
| 2012/0175691 A1 * | 7/2012 | Wu ........................ H01L 31/103 257/292 |
| 2014/0353468 A1 * | 12/2014 | Choi .................... H01L 27/1463 250/208.1 |

FOREIGN PATENT DOCUMENTS

KR 100889365 3/2009

OTHER PUBLICATIONS

Darby, B. L., et al., Substrate orientation dependence on the solid phase epitaxial growth rate of Ge, Journal of Applied Physics, 2013, p. 033505, vol. 113, No. 3.

* cited by examiner

*Primary Examiner* — Su C Kim
(74) *Attorney, Agent, or Firm* — IP & T Group LLP

(57) ABSTRACT

The present disclosure provides an image sensor. An image sensor may include: a transfer gate formed over a first substrate, and having a through-hole; a column-shaped epitaxial body having a first portion filled in the through-hole and a second portion formed over the transfer gate; a photoelectric conversion element formed in the second portion of the epitaxial body; and a floating diffusion region formed in the first substrate, and contacting the first portion of the epitaxial body.

38 Claims, 9 Drawing Sheets

IMAGE SENSOR HAVING VERTICAL TRANSFER GATE AND METHOD FOR FABRICATING THE SAME

CROSS-REFERENCE TO RELATED APPLICATIONS

The present application claims priority of Korean Patent Application No. 10-2015-0080993, filed on Jun. 9, 2015, which is incorporated herein by reference in its entirety.

BACKGROUND

Exemplary embodiments of the present invention relate to semiconductor device, and more particularly, to an image sensor having a vertical transfer gate and a fabrication method thereof.

An image sensor converts an optical image into electrical signals. Due to the development of the computer industry and the communication industry, the demand for image sensors with improved performance has increased in various fields such as digital cameras, camcorders, personal communication systems (PCS), game machines, security cameras, medical micro-cameras, and robots.

SUMMARY

Embodiments of the present invention provide an image sensor having improved performance and a fabrication method thereof.

In accordance with an embodiment of the present invention, an image sensor includes: a transfer gate formed on a first substrate and having a through-hole; a column-shaped epitaxial body having a first portion filled in the through-hole and a second portion formed on the transfer gate; a photoelectric conversion element formed in the second portion of the epitaxial body; and a floating diffusion region formed in the first substrate, and contacting the first portion of the epitaxial body.

The image sensor may further include a charge fixing layer formed on the top and side surfaces of the second portion of the epitaxial body. The charge fixing layer may extend to the outer side wall of the transfer gate. The charge fixing layer may fill the gap between the epitaxial bodies, which are adjacent. The charge fixing layer may have an air gap formed therein.

The image sensor may further include: a protective layer formed over the first substrate, and covering a structure including the epitaxial body and having a flat top surface; a color filter formed on the protective layer; and a light collection unit formed on the color filter.

The image sensor may further include a first logic circuit layer formed on the surface of the first substrate opposite to the transfer gate. In addition, the image sensor may further include a second substrate and a second logic circuit layer formed on the second substrate, and the first and second substrates may be stacked on each other by bonding so that the first and second logic circuit layers face each other.

The first substrate may include a thin substrate, and the floating diffusion region may pass through the first substrate. The through-hole may be located in the central portion of the transfer gate. The transfer gate may include a gate electrode and a gate insulating layer formed over an entire surface of the gate electrode, and covering the gate electrode. The through-hole and the second portion of the epitaxial body may have a cylindrical shape, and the diameter of the second portion of the epitaxial body may be greater than the diameter of the through-hole. The second portion of the epitaxial body may have a vertical side wall, or may have a slanted side wall so as to have a trapezoid shape. The first substrate and the epitaxial body may include a silicon-containing material in a single-crystal state. The crystal direction of the first substrate may be [100] perpendicular to the surface of the first substrate. The crystal direction of the epitaxial body may be [100] perpendicular to a surface of the first substrate, and the crystal direction of the epitaxial body may be [110] parallel to the surface of the first substrate. The photoelectric conversion element may include: a first impurity region formed over the transfer gate, and contacting the first portion of the epitaxial body; a second impurity region formed over the first impurity region and having a complementary conductivity type to the first impurity region; and a charge trapping region formed in the top and side surfaces of the second portion of the epitaxial body. The impurity doping concentration of the first impurity region may gradually increase from a boundary between the first and second impurity regions toward a boundary between the first impurity region and transfer gate. The charge trapping region may have the same conductivity type as that of the second impurity region and it may have an impurity doping concentration higher than that of the second impurity region.

In accordance with another embodiment of the present invention, a method for fabricating an image sensor includes: forming on a first substrate a transfer gate having a through-hole; forming a column-shaped epitaxial body by selective epitaxial growth from the first substrate exposed through the through-hole, wherein the epitaxial body may have a first portion filled in the through-hole and a second portion formed on the transfer gate; forming a photoelectric conversion element in the second portion of the epitaxial body; and forming a floating diffusion region contacting the first portion of the epitaxial body in the first substrate.

The method for fabricating the image sensor may further include, forming a charge fixing layer on the top and side surfaces of the second portion of the epitaxial body after the forming of the photoelectric conversion element. The charge fixing layer may extend to the outer side wall of the transfer gate. The charge fixing layer may fill the gap between the epitaxial bodies adjacent to each other. The charge fixing layer may have an air gap formed therein.

The method for fabricating the image sensor may further include: forming over the first substrate a protective layer covering a structure including the epitaxial body and having a flat top surface before the forming of the floating diffusion region; forming a color filter on the protective layer; and forming a light collection unit on the color filter.

The method for fabricating the image sensor may further include forming a first logic circuit layer on the surface of the first substrate opposite to the transfer gate after the forming of the floating diffusion region. In addition, the method for fabricating the image sensor may further include: forming a second logic circuit layer on the second substrate; and bonding the first substrate to the second substrate such that the first and second logic circuit layers face each other.

The forming of the transfer gate may include: forming a layer stack by sequentially forming a first insulating layer, a gate conductive layer and a second insulating layer over the first substrate; forming a preliminary transfer gate having a through-hole by selectively etching the layer stack; and forming a third insulating layer on the inner side wall and outer side wall of the preliminary transfer gate. The through-hole may be formed in the central portion of the transfer gate. The first substrate and the epitaxial body may include a silicon-containing material in a single-crystal state. The epitaxial body may be formed by growth from the first substrate having a [100] crystal direction perpendicular to the surface thereof. The epitaxial body may have a [100] crystal direction perpendicular to a surface of the first substrate, and a [110] crystal direction parallel to the surface of the first substrate. The second portion of the epitaxial body may have a vertical side wall. The second portion of the epitaxial body may have a slanted side wall so as to have a trapezoid shape. The forming of the photoelectric conversion element may include: forming a first impurity region by in situ doping of first impurity in the initial and middle stages of the forming of the second portion of the epitaxial body; forming a second impurity region by in situ doping of second impurity in the latter stage of the forming of the second portion of the epitaxial body; and forming a charge trapping region in the top and side surfaces of the second portion of the epitaxial body after the forming of the epitaxial body. The first impurity region may be formed such that the impurity doping concentration thereof gradually increases from a boundary between the first and second impurity regions toward a boundary between the first impurity region and the transfer gate. The charge trapping region may be formed by plasma doping (PLAD). The charge trapping region may be formed such that it has the same conductivity type as that of the second impurity region and it has an impurity doping concentration higher than that of the second impurity region. The forming of the floating diffusion region may include: reducing the thickness of the first substrate by a thinning process; and implanting impurity ions into the surface of the first substrate opposite to the transfer gate.

DETAILED DESCRIPTION

Figure 1:
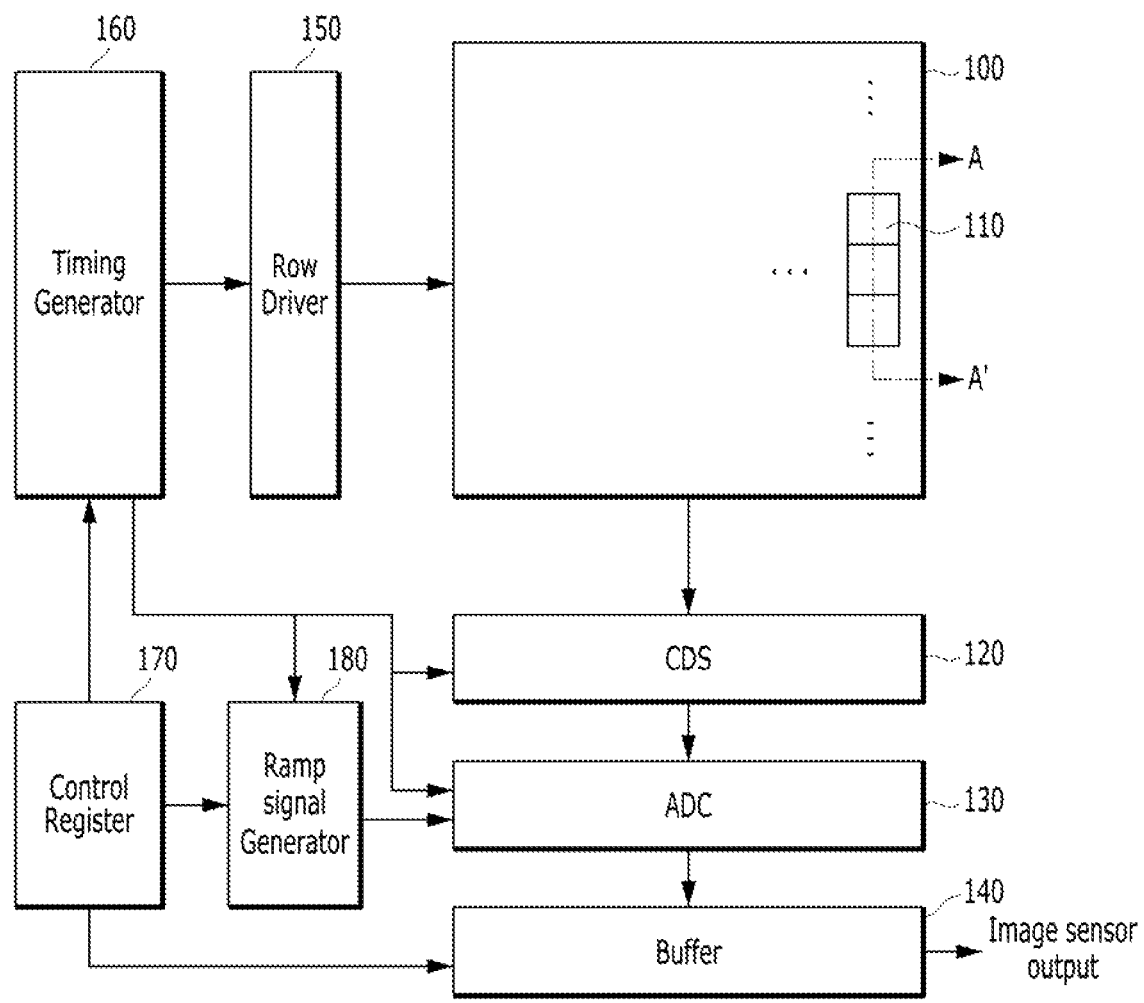
FIG. 1 is a block diagram schematically illustrating an image sensor in accordance with an embodiment of the present invention.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention. The drawings may not be necessarily to scale and, in some instances, proportions of at least some of structures in the drawings may have been exaggerated in order to clearly illustrate certain features of the described examples or implementations. In presenting a specific example in a drawing or description having two or more layers in a multi-layer structure, the positioning of such layers or the sequence of arranging the layers as shown reflects a particular implementation for the described or illustrated example and different positioning or sequence of arranging the layers may be possible. In addition, a described or illustrated example of a multi-layer structure may not reflect all layers present in that particular multilayer structure (e.g., one or more additional layers may be present between two illustrated layers). As a specific example, when a first layer in a described or illustrated multi-layer structure is referred to as being "on" or "over" a second layer or "on" or "over" a substrate, the first layer may be directly formed on the second layer or the substrate but may also represent a structure where one or more other intermediate layers exist between the first layer and the second layer or the substrate.

Embodiments of the present invention, as described below, provide an image sensor having improved performance and a fabrication method thereof. As used herein, the phrase "image sensor having increased performance" means an image sensor that provides a high-pixel image. To provide a high-pixel image, a highly integrated image sensor is required. Thus, an image sensor according to the present invention may include a vertical transfer gate and a three-dimensional photoelectric conversion element.

FIG. 1 is a block diagram schematically illustrating an image sensor in accordance with an embodiment of the present invention.

As illustrated in FIG. 1, the image sensor may include a pixel array 100, a correlated double sampling (CDS) unit 120, an analog-digital converter (ADC) 130, a buffer 140, a row driver 150, a timing generator 160, a control register 170, and a ramp signal generator 180. The pixel array 100 may include a plurality of unit pixels 110 arranged in a matrix.

The timing generator 160 may generate one or more control signals for controlling the row driver 150, the CDS unit 120, the ADC 130, and the ramp signal generator 180. The control register 170 may generate one or more control signals for controlling the ramp signal generator 180, the timing generator 160, and the buffer 140.

The row driver 150 may drive the pixel array 100 row by row. For example, the row driver 150 may generate a select signal for selecting any one row line of a plurality of row lines. Each of the unit pixels 110 may sense incident light and output an image reset signal and an image signal to the CDS unit 120 through a column line. The CDS unit 120 may perform sampling on the image reset signal and the image signal.

The ADC 130 may compare a ramp signal outputted from the ramp signal generator 180 with a sampling signal outputted from the CDS unit 120, and output a comparison signal. According to a clock signal provided from the timing generator 160, the ADC 130 may count the level transition time of the comparison signal, and output the count value to the buffer 140. The ramp signal generator 180 may operate under control of the timing generator 160.

The buffer 140 may store a plurality of digital signals outputted from the ADC 130, and then sense and amplify the digital signals. Thus, the buffer 140 may include a memory (not illustrated) and a sense amplifier (not illustrated). The memory may store count values. The count values may represent signals outputted from the plurality of unit pixels 110. The sense amplifier may sense and amplify the count values outputted from the memory.

In order to provide a high-pixel image, an increased number of unit pixels in a pixel array may be required. The increased number of unit pixels may be provided in a limited area, and accordingly, the unit pixel size and the distance between the unit pixels may be reduced. When the unit pixel size and the distance between the unit pixels are reduced, the cross-talk and dark current between adjacent unit pixels may increase.

Exemplary embodiments of the present invention may provide an image sensor suitable for a highly integrated circuit without increase of cross-talk and dark current.

Figure 2:
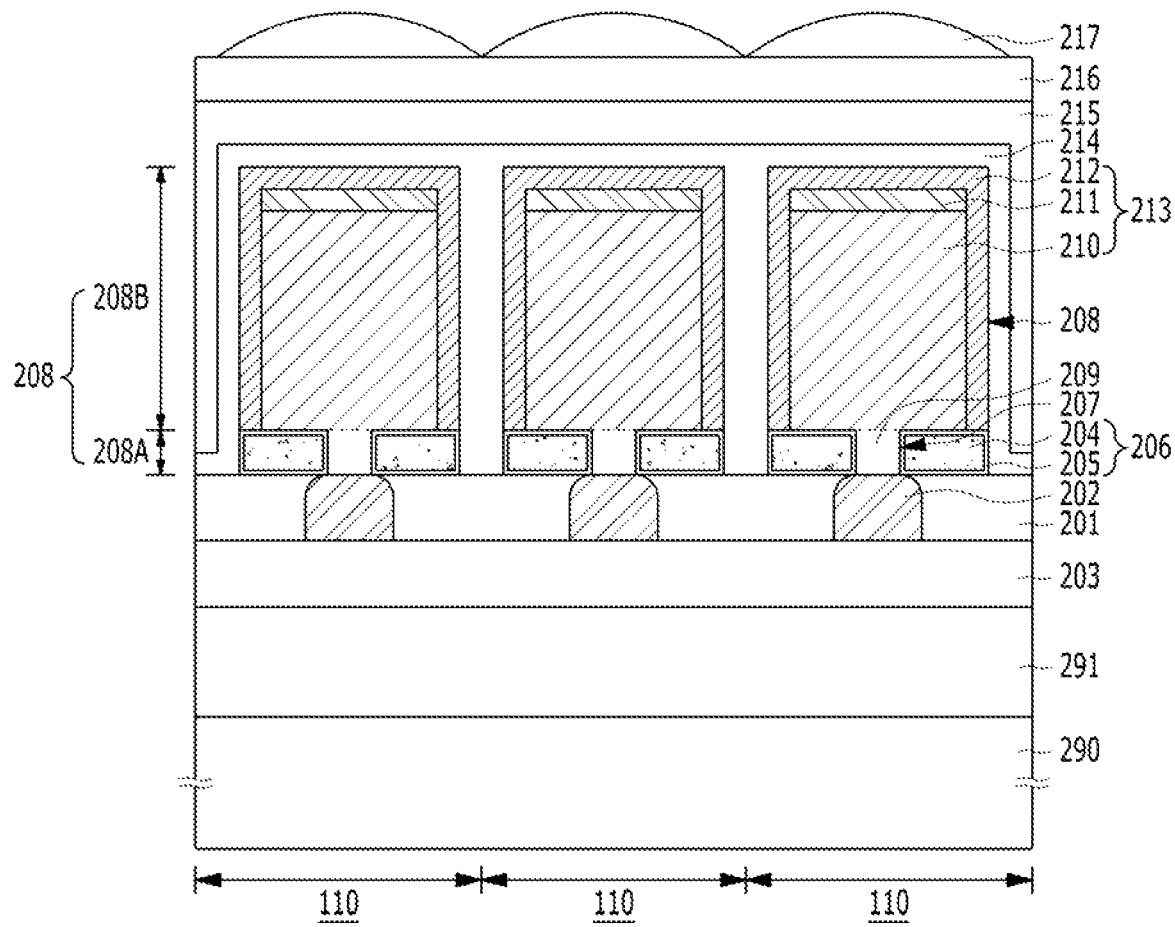
FIG. 2 is a cross-sectional view illustrating an image sensor shown in FIG. 1.
Figure 3A:
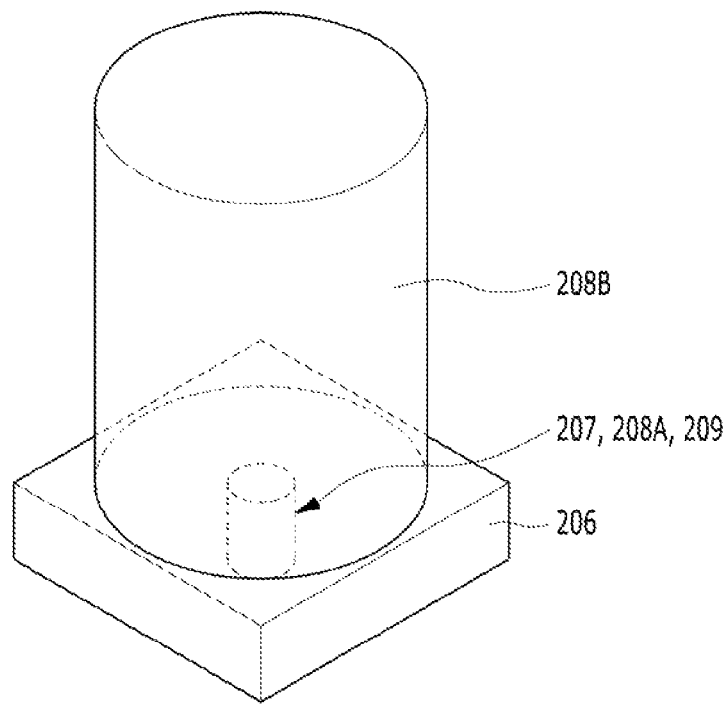
FIG. 3A is a perspective view illustrating a transfer gate and a photoelectric conversion element of an image sensor shown in FIG. 2.
Figure 3B:
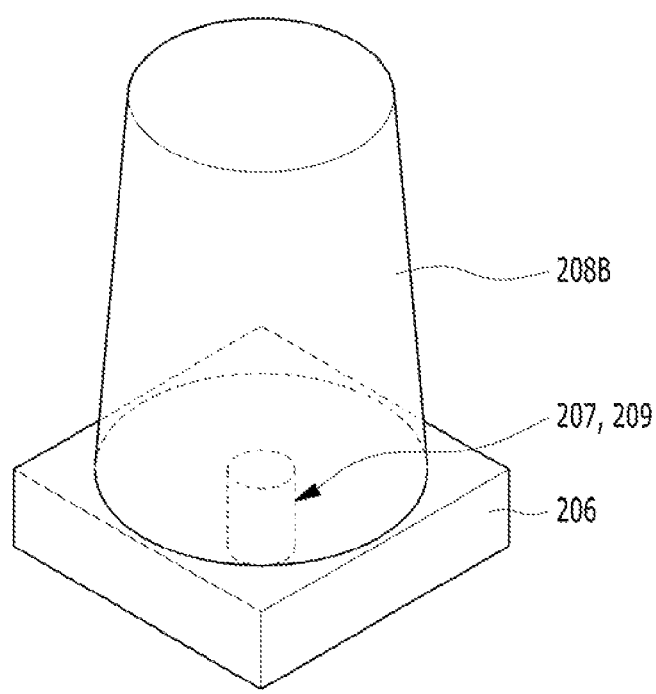
FIG. 3B is a perspective view illustrating a transfer gate and a photoelectric conversion element of an image sensor shown in FIG. 2.

FIG. 2 show the image sensor, cross-sectional view of which is taken along line A-A' as shown in FIG. 1. FIG. 3A is a perspective view showing a transfer gate and a photoelectric conversion element of the image sensor shown in FIG. 2. FIG. 3B is a perspective view illustrating a transfer gate and a photoelectric conversion element of an image sensor shown in FIG. 2. FIGS. 3A and 3B show different examples of the present invention.

As shown in FIGS. 2, 3A and 3B, the image sensor according to an embodiment of the present invention may include a first substrate 201, a plurality of floating diffusion regions 202 formed in the first substrate 201, and a first logic circuit layer 203 formed on the first substrate 201.

The first substrate 201 may include a semiconductor substrate. The semiconductor substrate may be in a single-crystal state, and may include a silicon-containing material. Specifically, the first substrate 201 may include a single crystal silicon-containing material. The surface of the first substrate 201 in a single-crystal state may have a specific crystal plane and crystal direction according to the Miller indices. For example, the surface of the first substrate 201 may have a (100) crystal plane. The crystal direction [100] of the first substrate 201 may be represented as perpendicular to the surface of the first substrate 201. For reference, the crystal plane is also called a "lattice plane", which is defined by three lattice points that do not form a straight line. The crystal direction is also called the "lattice direction" representing the direction of the crystal plane.

The first substrate 201 may be thinned by a thinning process. For example, the first substrate 201 may be a bulk silicon substrate whose thickness becomes reduced by a thinning process. In addition, the first substrate 201 may be a P-type substrate. As used herein, the term "P-type substrate" means a substrate doped with P-type impurities throughout.

The plurality of floating diffusion regions 202 may be disposed to respectively correspond to a plurality of unit pixels 110. For example, the plurality of floating diffusion regions 202 may be disposed in a matrix, and adjacent floating diffusion regions 202 may be spaced apart. Specifically, each of the plurality of floating diffusion regions 202 may be located below a transfer gate 206 and through-hole 207 formed in each of the plurality of unit pixels 110. Each of the plurality of floating diffusion regions 202 may pass through the first substrate 201, which is thin. The plurality of floating diffusion regions 202 may be N-type impurity regions. Because only the plurality of floating diffusion regions 202 are formed in the first substrate 201 in an area corresponding to the pixel array as described above, the capacity of the floating diffusion regions 202 may be increased.

The first logic circuit layer 203 formed on the first substrate 201 may include a signal processing circuit configured to process a pixel signal generated by the plurality of unit pixels 110 in response to incident light. Although not shown in the figures, the signal processing circuit may include the CDS unit 120, the ADC 130, the buffer 140, the row driver 150, the timing generator 160, the control resistor 170 and the ramp signal generator 180 as described above with reference to FIG. 1. To realize such elements, the signal processing circuit may include a plurality of transistors, a plurality of wiring layers, a plurality of interlayer insulating layers, and a plurality of plugs that connect them to one another.

In addition, the image sensor according to the present invention may include a second substrate 290 and a second logic circuit layer 291 formed on the second substrate 290. The first and second substrates 201 and 290 may be stacked by a wafer bonding process so that the first and second logic circuit layers 203 and 291 will face each other. Thus, the first and second logic circuit layers 203 and 291 may be electrically connected, and may include a member for their connection. As described above, because the image sensor according to the embodiment of the present invention includes the first and second logic circuit layers 203 and 291 formed on different substrates and bonded to each other by a wafer bonding process, the integration density of the image sensor may be significantly increased.

The second substrate 290 may include a semiconductor substrate. The semiconductor substrate may be in a single-crystal state, and may include a silicon-containing material. Specifically, the first substrate 290 may include a single crystal silicon-containing material.

The second logic circuit layer 291 formed on the second substrate 290 may include application processors (APs), which include an image processor. For example, the second logic circuit layer 291 may include an image signal processor (ISP). To realize such elements, the second logic circuit layer 291 may include a plurality of transistors, a plurality of wiring layers, a plurality of interlayer insulating layers, and a plurality of plugs that connect them to one another.

In addition, the image sensor according to the embodiment of the present invention may include a transfer gate 206, which is formed on the first substrate 201 so as to correspond to one of the plurality of unit pixels 110 and has a through-hole 207, a column-shaped epitaxial body 208, which includes a first portion filled in the through-hole 207 and a second portion formed on the transfer gate 206, and a photoelectric conversion element 213 formed in the second portion 208B of the epitaxial body 208.

The transfer gate 206 may be in the form of a flat plate corresponding to the unit pixel 110. The transfer gate 206 may include a gate insulating layer 205 and a gate electrode 204 covered by the gate insulating layer 205. In other words, the gate electrode 204 may be insulated from a neighboring structure by the gate insulating layer 205.

The through-hole 207 formed in the transfer gate 206 may provide a vertical channel 209 for the transfer gate 206, and may provide a space for forming the epitaxial body 208. The through-hole 207 may be located in the central portion of the transfer gate 206 and may be cylindrical in shape. The second portion 208B of the epitaxial body 208 may depend on the position and shape of the through-hole 207. The through-hole 207 and the second portion 208B of the epitaxial body 208 may have the same shape. Specifically, the through-hole 207 and the second portion 208B of the epitaxial body 208 may have a cylindrical shape, and the diameter of the second portion 208B of the epitaxial body may be greater than that of the through-hole 207. Herein, the second portion 208B of the epitaxial body 208 may have a cylindrical shape. As shown in FIGS. 3A and 3B, the second portion 208B of the epitaxial body 208 may have either a vertical sidewall, or a slanted sidewall so as to have a trapezoid shape. Thus, the light-receiving area and quantum efficiency of the photoelectric conversion element 213 may be controlled according to the shape of the second portion 208B of the epitaxial body 208.

The epitaxial body 208 may be formed by selective epitaxial growth (SEG) from the first substrate 201 exposed through the through-hole 207. The epitaxial body 208 may include the same material as that of the first substrate 201. Specifically, the epitaxial body 208 may include a silicon-containing material. For example, the epitaxial body 208 may be made of epitaxial silicon. The epitaxial body 208 may correspond to one of the plurality of unit pixels 110, and may be self-isolated during a growth process without undergoing a separate isolation process. For this self-isolation, the crystal direction of the epitaxial body 208, which is perpendicular to the surface of the first substrate 201, may be [100], and the crystal direction of the epitaxial body 208, which is parallel to the surface of the first substrate 201, may be [110]. This is because there is a difference in growth rate between the crystal directions. It is well known that the growth rate in the [100] crystal direction is 4 times higher than the growth rate in the [110] crystal direction. Due to the difference in growth rate between the crystal directions, the second portion 208B of the epitaxial body 208 may have the vertical sidewall as shown in FIG. 3A. Alternatively, the second portion 208B of the epitaxial body 208 may also have the slanted sidewall so as to have the trapezoid shape as shown in FIG. 3B. A process of forming the epitaxial body 208 based on this difference in growth rate between crystal directions will be described below with respect to a fabrication method shown in FIG. 4C.

The first portion 208A of the epitaxial body 208 may function as a vertical channel 209 in the transfer gate 206. For this function, the first portion 208A of the epitaxial body 208 may be undoped or lightly doped with P-type impurity.

In the second portion 208B of the epitaxial body 208, a photoelectric conversion element 213 may be formed. The photoelectric conversion element 213 may include a first impurity region 210 formed on the transfer gate 206 so as to contact the vertical channel 209, a second impurity region 211 formed on the first impurity region 210 in the remaining portion of the second portion 208B of the epitaxial body 208, and having a complementary conductivity type to the first impurity region 210, and a charge trapping region formed in the top and side surfaces of the second portion 208B of the epitaxial body 208. The first impurity region 210 may have N-type conductivity, and the second impurity region 211 may have P-type conductivity. The first impurity region 210 may have a uniform doping profile or may have a doping profile of impurity doping concentration gradually increasing from the boundary between the first and second impurity regions 210 and 211 toward the boundary between the first impurity region 210 and the transfer gate 206. The gradually increasing doping profile may enable photo-charges, which are produced at the boundary between the first and second impurity regions 210 and 211, to be more effectively transferred to the transfer gate 206. The charge trapping region 212 may have the same conductivity type as that of the second impurity region 211, but may have higher impurity doping concentration than that of the second impurity region 211. The charge trapping region 212 may have a constant thickness along the surface of the second portion 208B of the epitaxial body 208. The charge trapping region 212 may remove a dark current source and may induce fill depletion of the first and second impurity regions 210 and 211, thereby improving the characteristics of the photoelectric conversion element 213.

In addition, the image sensor according to the embodiment of the present invention may include a charge fixing layer 214 formed on the top and side surfaces of the second portion 208B of the epitaxial body 208, a protective layer 215 formed on the charge fixing layer 214, a color filter formed on the protective layer 215, and a light collection unit 217 formed on the color filter. The light collection unit 217 may include a hemispherical lens.

The charge fixing layer 214 may improve dark current characteristics together with the charge trapping region 212. For this function, the charge fixing layer 214 may include a highly dielectric material. For example, the charge fixing layer 214 may be either a single layer formed of any one selected from the group consisting of $HfO_2$, $Ta_2O_5$, $ZrO_2$, $PrO_x$, $TiO_2$, HfSiO, $Y_2O_3$ and HfAlON, or a multilayer formed by stacking two or more of these materials.

The charge fixing layer 214 formed on the top and side surfaces of the second portion 208B of the epitaxial body 208 may extend to the outer side wall of the transfer gate 206. In other words, the charge fixing layer 214 may cover the outer wall of the second portion 208B of the epitaxial body 208 and the outer side wall of the transfer gate 206. The charge fixing layer 214 may have a constant thickness along the surface of the structure including the epitaxial body 208 and may fill the gap between adjacent unit pixels 110. Although not shown in the figures, the charge fixing layer 214 may fill the gap between adjacent unit pixels 110 and an air gap may be provided in the charge fixing layer 214. As described above, because the charge fixing layer 214 fills the gap between adjacent unit pixels 110, the charge fixing layer 214 may also isolate adjacent epitaxial bodies 208 and transfer gates 206 from each other.

The color filter 216 may perform color separation, and may include a red filter, a green filter, a blue filter, a cyan filter, a yellow filter, a magenta filter, a white filter, a black filter, an IR cutoff filter, etc.

The image sensor according to an embodiment of the present invention may include the vertical transfer gate 206 and the three-dimensional photoelectric conversion elements 213 formed in the epitaxial body 213 on the vertical transfer gate 206. Therefore, the Integration density of the image sensor may be increased without an increase of cross-talk and dark current.

FIGS. 4A to 4H are cross-sectional views illustrating a method for fabricating an image sensor according to an embodiment of the present invention.

Figure 4A:
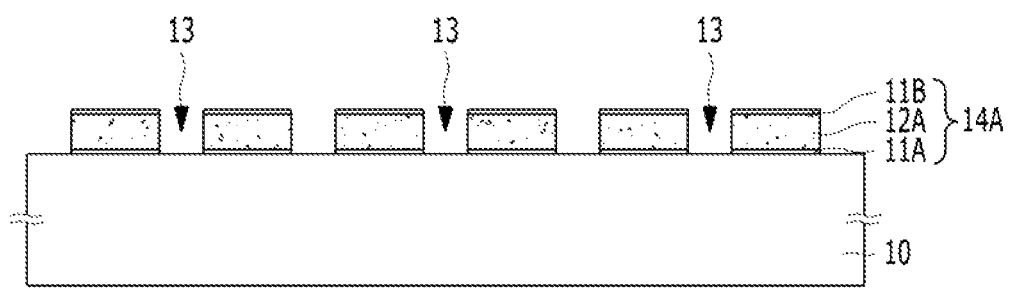
FIGS. 4A to 4H are cross-sectional views illustrating a method for fabricating an image sensor according to an embodiment of the present invention.

As shown in FIG. 4A, a first substrate 10 may be prepared. The first substrate 10 may include a semiconductor substrate. The semiconductor substrate may be in a single-crystal state. In other words, the first substrate 10 may include a single crystal silicon-containing material. The crystal plane of the surface of the first substrate 10 in a single-crystal state may be a (100) plane and the crystal direction of the first substrate 10 perpendicular to the surface of the first substrate 10 may be [100]. According to the crystal direction of the surface of the first substrate 10, the crystal structure and shape of an epitaxial body to be formed in a subsequent process may be controlled.

Next, preliminary transfer gates 14A may be formed on the first substrate 10 to correspond to a plurality of unit pixels, respectively. In the process of forming the preliminary transfer gates 14A, the preliminary transfer gates 14A may be formed together with through-holes 13 in which vertical channels are to be formed. Each of the through-holes 13 may be located in the central portion of each of the preliminary transfer gates 14A, and may have a cylindrical shape. The preliminary transfer gate 14A may be formed by selectively etching a first insulating layer 11A, a gate conductive layer 12A and a second insulating layer 11B on the first substrate 10 after sequentially forming the layers. Each of the first and second insulating layers 11A and 11B may be either a single layer of any one selected from the group consisting of an oxide layer, a nitride layer and an oxynitride layer, or a multilayer of two or more of these layers. The gate conductive layer 12A may include a silicon-containing material or a metal-containing material.

Figure 4B:
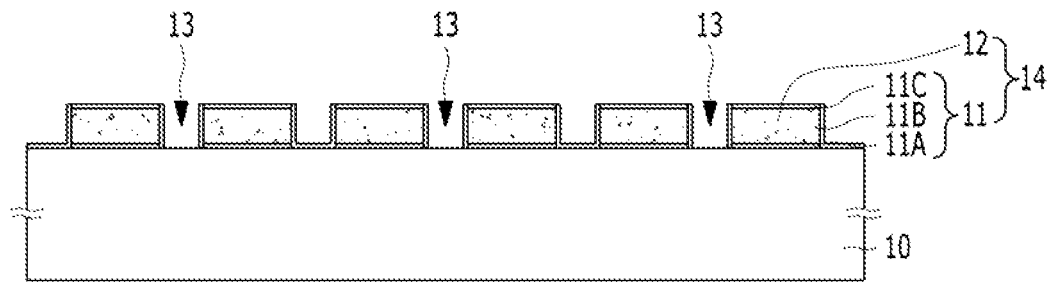

As shown in FIG. 4B, a third insulating layer 11C may be formed on the inner side wall and outer side wall of the preliminary transfer gates 14A. The inner side wall of the preliminary transfer gates 14A may be the side wall of the through-hole 13. The third insulating layer 11C may be either a single layer of any one selected from the group consisting of an oxide layer, a nitride layer and an oxynitride layer, or a multilayer of two or more of these layers.

As a result, a gate insulating layer 11 may be formed. The gate insulating layer 11 may include the first to third gate insulating layers 11A to 11C and may cover a gate electrode 12, and a transfer gate 14 including the gate insulating layer 11. Hereinafter, the gate insulating layer 11 will be shown in the figures without division into the first to third gate insulating layers 11A to 11C.

The third insulating layer 11C formed between the transfer gates 14 or between unit pixels may be formed on the side wall of the preliminary transfer gate 14A to extend to the first substrate 10. The third insulating layer 11C extending to the first substrate 10 may prevent an epitaxial body from being formed between the transfer gates 14 in a subsequent process of forming the epitaxial body.

Figure 4C:
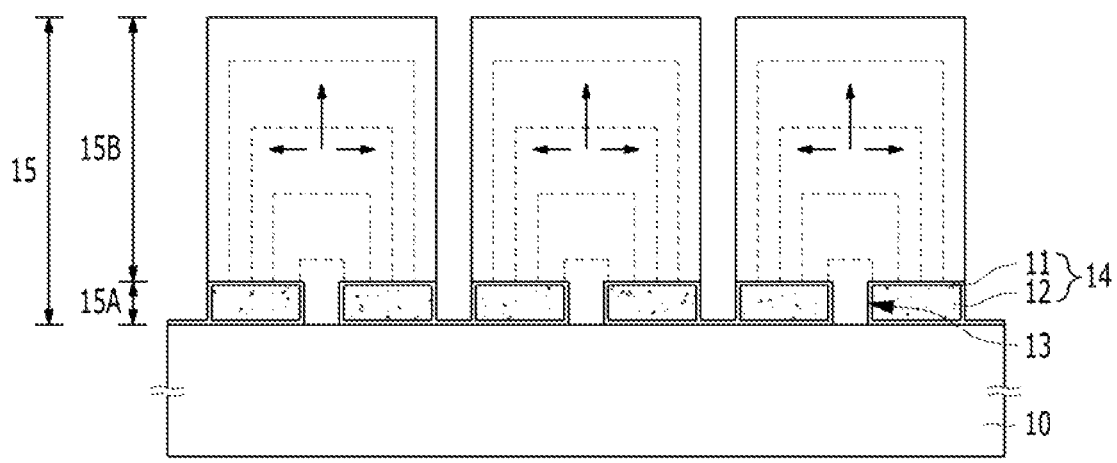

As shown in FIG. 4C, an epitaxial body 15 may be formed by selective epitaxial growth from the first substrate 10 exposed through the through-hole 13 of the transfer gate 14. The epitaxial body 15 may have a first portion 15A filled in the through-hole 13 and a second portion 15B formed on the transfer gate 14 so as to have a column shape. The epitaxial body 15 may include the same material as that of the first substrate 10. For example, the epitaxial body 15 may be formed of epitaxial silicon. The epitaxial body 15 may be formed in such a manner that adjacent epitaxial bodies 15 are self-isolated from each other based on the difference in growth rate between crystal directions.

Specifically, it is well known that, among the growth rates of epitaxial silicon growing from bases having [100], [110] and [111] crystal directions, one from the base having [100] crystal direction is the highest and one from the base having [111] crystal direction is the lowest. In addition, it is well known that the growth rate from the base having [110] crystal direction is about ¼ of the growth rate from the base having [100] crystal direction. The epitaxial body 15 grown from the first substrate 10, whose crystal direction is [100] perpendicular to the surface of the first substrate 10, may have [100] and [110] crystal directions, which are respectively perpendicular and parallel to the first substrate 10. Due to the difference in growth rate between [100] and [110] crystal directions, the epitaxial body 15 having [100] and [110] crystal directions may grow at different growth rates from the first substrate 10 and thus self-isolated column-shaped epitaxial bodies 15 may be formed.

Because the epitaxial body 15 is grown while filling the through-hole 13, the shape of the epitaxial body 15 may depend on the shape of the through-hole 13. For example, when the through-hole 13 has a cylindrical shape, the epitaxial body 15 may also have a cylindrical shape. In this case, the epitaxial body 15 may have a vertical side wall, or may have a slanted side wall so as to have a trapezoid shape as described with reference to FIGS. 3A and 3B.

Figure 4D:
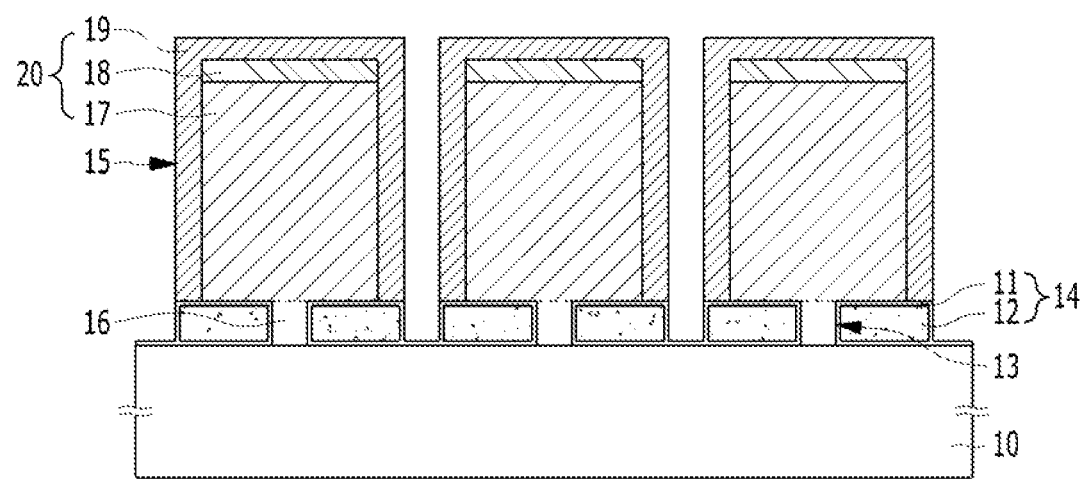

As shown in FIG. 4D, the first portion 15A of the epitaxial body 15, which is formed by the above-described process, may function as a vertical channel 16 in a transfer gate 14. A photoelectric conversion element 20 may be formed in the second portion 15B of the epitaxial body 15. The photoelectric conversion element 20 may include a first impurity region 17, a second impurity region formed on the first impurity region 17 and having a complementary conductivity type to the first impurity region 17, and a charge trapping region 19 formed in the top and side surfaces of the second portion 15B of the epitaxial body 15. The photoelectric conversion element 20 may be formed together with the second portion 15B of the epitaxial body in the process of forming the second portion 15B.

Specifically, in the initial and middle stages of the process of growing the second portion 15B of the epitaxial body 15, the second portion 15B may be in situ doped with N-type impurity to form a first impurity region 17. The first impurity region 17 may have a uniform doping concentration in a vertical direction or to have the impurity doping concentration gradually decreasing getting farther from the transfer gate 14. Next, in the latter stage of the process of growing the second portion 15B of the epitaxial body 15, the second portion 15B may be in situ doped with P-type impurity to form a second impurity region 18. After the second portion 15B of the epitaxial body 15 is formed, P-type impurity may be doped into the top and side surfaces of the second portion 15B of the epitaxial body 15 to form a charge trapping region 19. The charge trapping region 19 may have an impurity doping concentration higher than that of the second impurity region 18. The charge trapping region 19 may be formed in the top and side surfaces of the second portion 15B of the epitaxial body 15 to have a constant thickness. Herein, a doping process for forming the charge trapping region 19 may be performed through plasma doping (PLAD). The charge trapping region 19 may remove a dark current source and induce full depletion of the photoelectric conversion element, thereby improving the characteristics of the photoelectric conversion element 20.

Figure 4E:
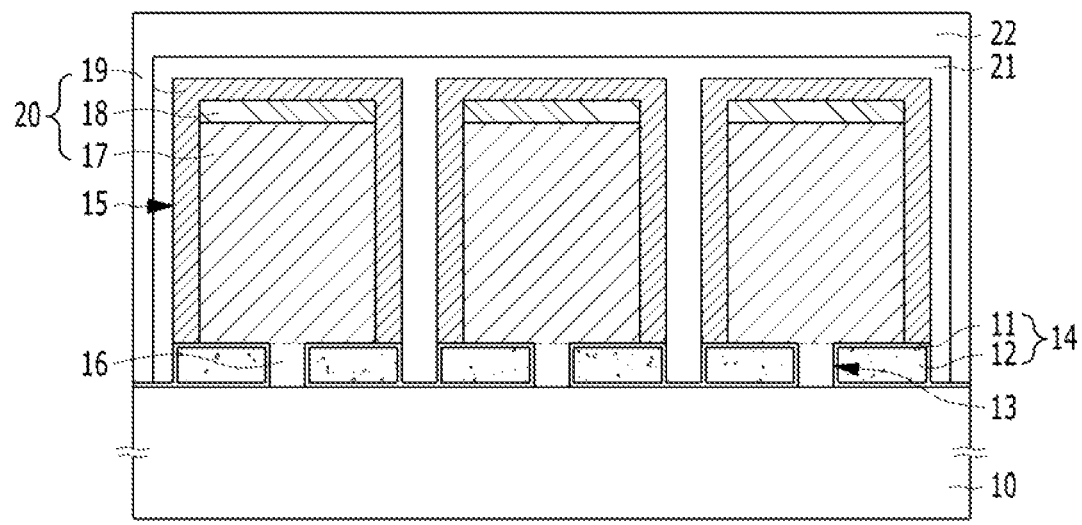

As shown in FIG. 4E, a charge fixing layer 21 may be formed along the surface of the structure including the photoelectric conversion element 20. The charge fixing layer 21 may improve dark current characteristics together with the charge trapping region 19. Thus, the charge fixing layer 21 may include an insulating layer, for example, a highly dielectric layer. For example, the charge fixing layer 21 may be either a single layer formed of any one selected from the group consisting of $HfO_2$, $Ta_2O_5$, $ZrO_2$, $PrO_x$, $TiO_2$, HfSiO, $Y_2O_3$ and HfAlON, or a multilayer formed by stacking two or more of these materials.

The charge fixing layer 21 may have a constant thickness along the surface of the structure including the photoelectric conversion element 20 and to fill the gap between adjacent unit pixels. Although not shown in the figures, an air gap may be provided in the charge fixing layer 21 that fills the gap between adjacent unit pixels. As described above, because the charge fixing layer 21 is formed so as to fill the gap between adjacent unit pixels, it may isolate adjacent epitaxial bodies 20 and transfer gates 14 from each other.

Next, a protective layer 22 may be formed on the charge fixing layer 21 so as to cover the entire surface of the pixel array and to have a flat top surface. The protective layer 22 may include an insulating layer.

Although not shown in the figures, a handle wafer for a subsequent thinning process may be bonded to the protective layer 22.

Figure 4F:
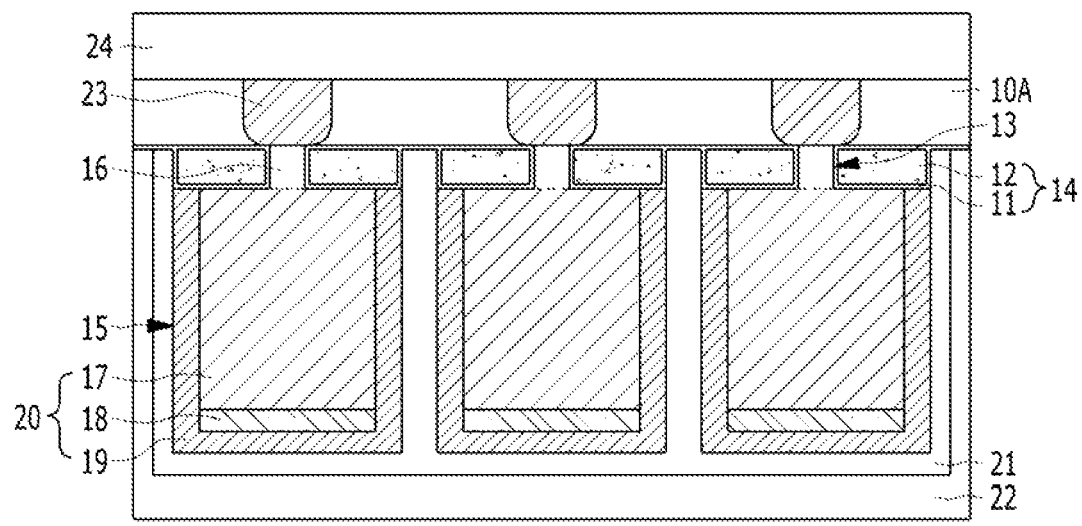

As shown in FIG. 4F, a thinning process may be performed to thin the first substrate 10A. In other words, a thinning process may be performed to reduce the thickness of the first substrate 10A.

Next, impurity ions may be implanted into the exposed surface of the first substrate 10A, which is opposite to the transfer gates 14, to form floating diffusion regions 23 passing through the first substrate 10A and contacting the vertical channels 16 of the transfer gates 14, which are the first portions 15A of the epitaxial bodies 15.

Thereafter, a first logic circuit layer 24 may be formed on the first substrate 10A. The first logic circuit layer 24 may include a signal processing circuit configured to process pixel signals produced in the unit pixels. Although not shown in the figures, the signal processing circuit may include the CDS unit 120, the ADC 130, the buffer 140, the row driver 150, the timing generator 160, the control resistor 170 and the ramp signal generator 180 as described above with reference to FIG. 1. To realize such elements, the signal processing circuit may include a plurality of transistors, a plurality of wiring layers, a plurality of interlayer insulating layers, and a plurality of plugs that connect them to one another.

Figure 4G:
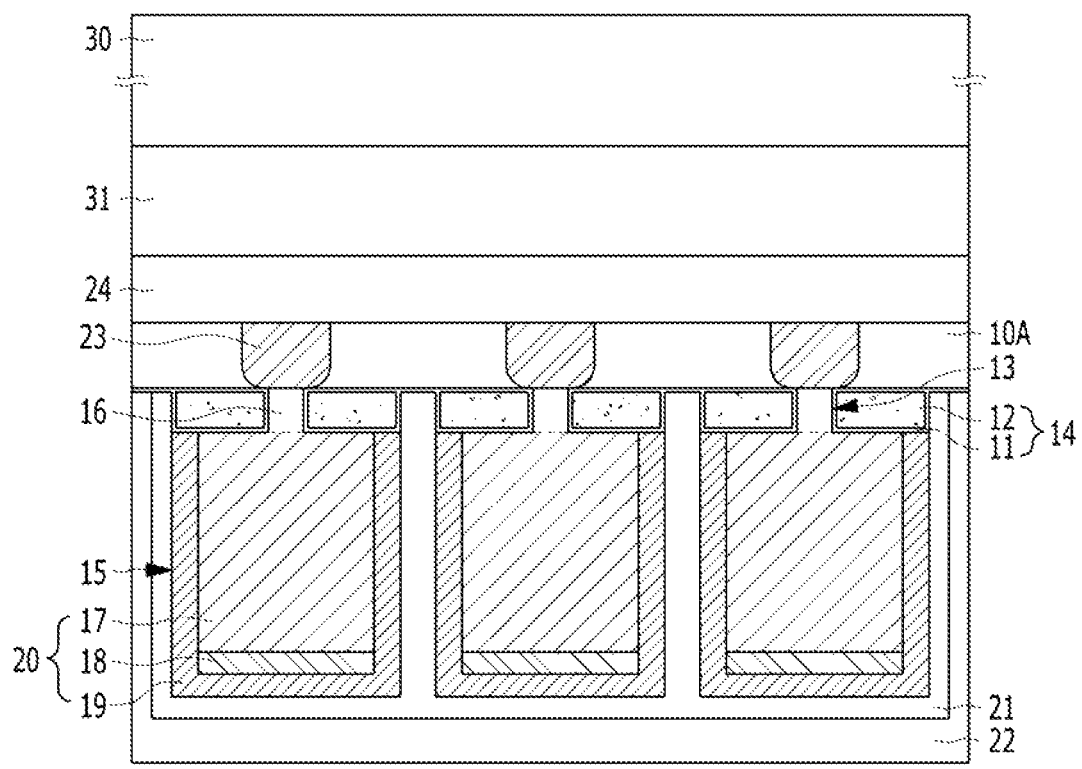

As shown in FIG. 4G, a second logic circuit layer 31 may be formed on the second substrate 30. The second logic circuit layer 31 may include application processors (APs), which includes an image processor. For example, the second logic circuit layer may include an image signal processor (ISP). To realize these elements, the second logic circuit layer may include a plurality of transistors, a plurality of wiring layers, a plurality of interlayer insulating layers, and a plurality of plugs that connect them to one another.

Next, the first and second substrates 10A and 30 may be bonded so that the first and second logic circuit layers 24 and 31 face each other. Although not shown in the figures, the first and second logic circuit layers 24 and 31 may be electrically connected, and may include a member for connecting them to each other.

As a result, a stack structure may be formed which includes the pixel array structure including the photoelectric conversion element 20, the first substrate 10A, the first logic circuit layer 24, the second logic circuit layer 31 and the second substrate 30. As described above, because the logic circuits for signal processing are stacked on each other, the integration density of the image sensor may be significantly increased.

After completion of the bonding process, the handle wafer bonded to the protective layer 22 may be removed.

Figure 4H:
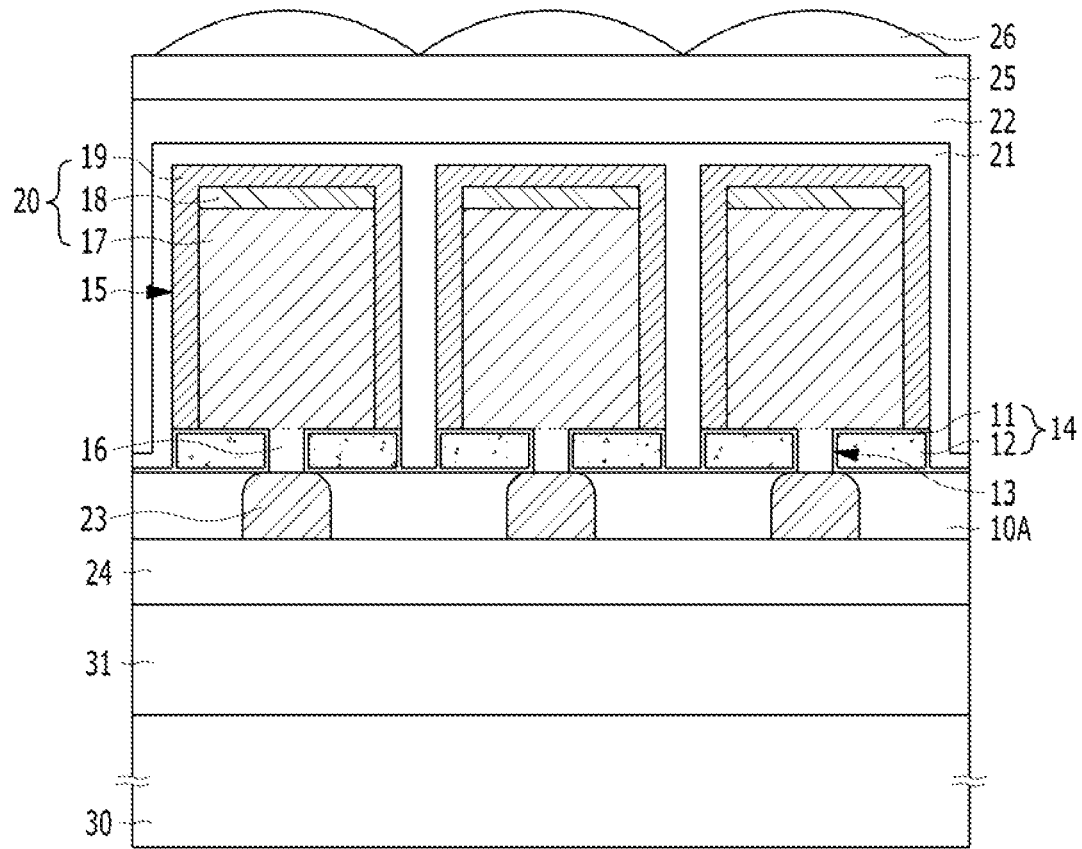

As shown in FIG. 4H, a color filter 25 and a light collection unit 26 may be sequentially formed on the protective layer 22. The color filter 25 may perform color separation, and may include a red filter, a green filter, a blue filter, a cyan filter, a yellow filter, a magenta filter, a white filter, a black filter, an IR cutoff filter, etc. The light collection unit 26 may include a hemispherical lens.

Thereafter, the image sensor according to the embodiment of the present invention may be completed by known image sensor fabrication technology.

According to the above-described method for fabricating the image sensor, the image sensor having a reduced unit pixel size as a result of an increase in the integration density may be more easily fabricated by forming the three-dimensional photoelectric conversion element 20 based on the difference in growth rate between crystal directions.

The image sensor in accordance with an embodiment of the present invention may be used in various electronic devices or systems. Hereafter, the image sensor in accordance with an embodiment of the present invention which is applied to a camera will be described with reference to FIG. 5.

Figure 5:
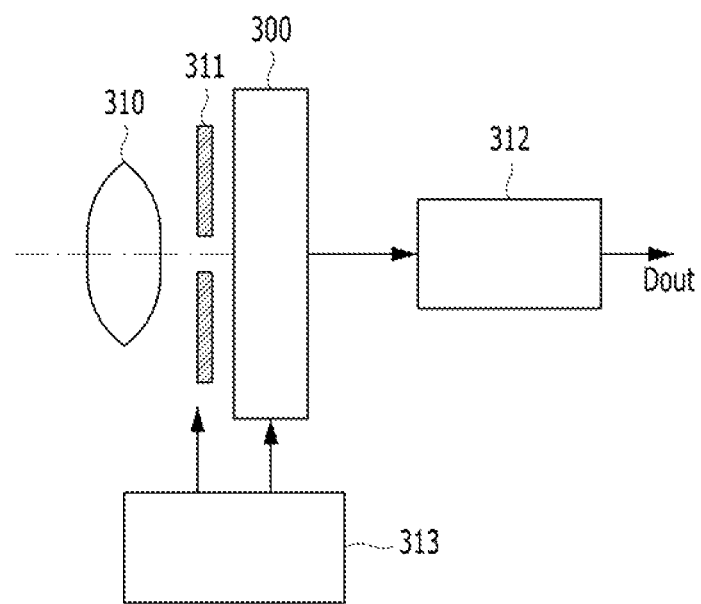
FIG. 5 is a diagram schematically illustrating an electronic device including an image sensor shown in FIG. 1.

FIG. 5 is a diagram schematically illustrating an electronic device including an image sensor shown in FIG. 1.

Referring to FIG. 5, the electronic device including the image sensor in accordance with an embodiment of the present invention may be a camera capable of taking a still image or moving image. The electronic device may include an optical system or optical lens 310, a shutter unit 311, a driving unit 313 for controlling/driving the image sensor 300 and the shutter unit 311, and a signal processing unit 312.

The optical system 310 may guide image light from an object to the pixel array 100 of the image sensor 300. The optical system 310 may include a plurality of optical lenses. The shutter unit 311 may control the light irradiation period and the light shield period for the image sensor 300. The driving unit 313 may control a transmission operation of the image sensor 300 and a shutter operation of the shutter unit 311. The signal processing unit 312 may process signals outputted from the image sensor 300 in various manners. The processed image signals Dout may be stored in a storage medium such as a memory or outputted to a monitor or the like.

As described above, the image sensor according to the present invention includes the vertical transfer gate and the three-dimensional photoelectric conversion element formed in the epitaxial body on the vertical transfer gate, and thus the integration density of the image sensor may be increased without increase of cross-talk and dark current.

While the present invention has been described with respect to the specific embodiments, it will be apparent to those skilled in the art that various changes and modifications may be made without departing from the spirit and scope of the invention as defined in the following claims.

What is claimed is:

1. An image sensor comprising:
   a transfer gate formed over a first substrate, and having a through-hole;
   a column-shaped epitaxial body having a first portion filled in the through-hole and a second portion formed over the transfer gate;
   a photoelectric conversion element formed in the second portion of the epitaxial body;
   a floating diffusion region formed in the first substrate, and contacting the first portion of the epitaxial body; and
   a charge fixing layer formed along top and side surfaces of the second portion of the column-shaped epitaxial body to cover the top and side surfaces of the second portion of the column-shaped epitaxial body,
   wherein the through-hole of the transfer gate is formed inside the transfer gate and provides a vertical channel for the transfer gate.

2. The image sensor of claim 1, wherein the charge fixing layer extends to an outer side wall of the transfer gate.

3. The image sensor of claim 1, wherein the charge fixing layer fills a gap between the epitaxial body and an adjacent epitaxial body.

4. The image sensor of claim 3, wherein the charge fixing layer has an air gap.

5. The image sensor of claim 1, further comprising:
a protective layer formed over the first substrate, and covering a structure including the epitaxial body and having a flat top surface;
a color filter formed over the protective layer; and
a light collection unit formed over the color filter.

6. The image sensor of claim 1, further comprising a first logic circuit layer formed over a surface of the first substrate and opposite to the transfer gate.

7. The image sensor of claim 6,
further comprising a second substrate and a second logic circuit layer formed over the second substrate,
wherein the first and second substrates are stacked by bonding such that the first and second logic circuit layers face each other.

8. The image sensor of claim 1,
wherein the first substrate comprises a thin substrate, and
wherein the floating diffusion region passes through the first substrate.

9. The image sensor of claim 1, wherein the through-hole is located in a central portion of the transfer gate.

10. The image sensor of claim 1, wherein the transfer gate comprises:
a gate electrode; and
a gate insulating layer formed over an entire surface of the gate electrode, and covering the gate electrode.

11. The image sensor of claim 1,
wherein the through-hole and the second portion of the epitaxial body have a cylindrical shape, and
wherein a diameter of the second portion of the epitaxial body is greater than a diameter of the through-hole.

12. The image sensor of claim 1, wherein the second portion of the epitaxial body has a vertical side wall.

13. The image sensor of claim 1, wherein the second portion of the epitaxial body has a slanted side wall, and has a trapezoid shape.

14. The image sensor of claim 1, wherein the first substrate and the epitaxial body comprise a silicon-containing material in a single-crystal state.

15. The image sensor of claim 1, wherein a crystal direction of the first substrate is [100] perpendicular to a surface of the first substrate.

16. The image sensor of claim 1, wherein a crystal direction of the epitaxial body is [100] perpendicular to a surface of the first substrate, and
a crystal direction of the epitaxial body is [110] parallel to the surface of the first substrate.

17. The image sensor of claim 1, wherein the photoelectric conversion element comprises:
a first impurity region formed over the transfer gate, and contacting the first portion of the epitaxial body;
a second impurity region formed over the first impurity region and having a complementary conductivity type to the first impurity region; and
a charge trapping region formed in top and side surfaces of the second portion of the epitaxial body.

18. The image sensor of claim 17, wherein an impurity doping concentration of the first impurity region gradually increases from a boundary between the first and second impurity regions toward a boundary between the first impurity region and the transfer gate.

19. The image sensor of claim 17,
wherein the charge trapping region has the same conductivity type as that of the second impurity region, and
wherein the charge trapping region has an impurity doping concentration higher than that of the second impurity region.

20. A method for fabricating an image sensor, comprising:
forming over a first substrate a transfer gate having a through-hole;
forming a column-shaped epitaxial body by selective epitaxial growth from the first substrate exposed through the through-hole, wherein the epitaxial body has a first portion filled in the through-hole and a second portion formed over the transfer gate;
forming a photoelectric conversion element in the second portion of the epitaxial body;
forming a charge fixing layer along top and side surfaces of the second portion of the column-shaped epitaxial body to cover the top and side surfaces of the second portion of the column-shaped epitaxial body; and
forming a floating diffusion region contacting the first portion of the epitaxial body in the first substrate,
wherein the through-hole of the transfer gate is formed inside the transfer gate and provides a vertical channel for the transfer gate.

21. The method of claim 20, wherein the charge fixing layer is formed to extend to an outer side wall of the transfer gate.

22. The method of claim 20, wherein the charge fixing layer is formed to fill a gap between the epitaxial body and an adjacent epitaxial body.

23. The method of claim 22, wherein the charge fixing layer is formed with an air gap.

24. The method of claim 20, further comprising:
forming over the first substrate a protective layer covering a structure including the epitaxial body and having a flat top surface before the forming of the floating diffusion region;
forming a color filter over the protective layer; and
forming a light collection unit over the color filter.

25. The method of claim 20, further comprising forming a first logic circuit layer over a surface of the first substrate opposite to the transfer gate after the forming of the floating diffusion region.

26. The method of claim 25, further comprising:
forming a second logic circuit layer over the second substrate; and
bonding the first substrate to the second substrate such that the first and second logic circuit layers face each other.

27. The method of claim 20, wherein the forming of the transfer gate comprises:
forming a layer stack by sequentially forming a first insulating layer, a gate conductive layer and a second insulating layer over the first substrate;
forming a preliminary transfer gate having a through-hole by selectively etching the layer stack; and
forming a third insulating layer over an inner side wall and outer side wall of the preliminary transfer gate.

28. The method of claim 20, wherein the through-hole is formed in a central portion of the transfer gate.

29. The method of claim 20, wherein the first substrate and the epitaxial body comprise a silicon-containing material in a single-crystal state.

30. The method of claim 20, wherein the epitaxial body is formed by growth from the first substrate having a [100] crystal direction perpendicular to a surface thereof.

31. The method of claim 20, wherein the epitaxial body is formed to have a [100] crystal direction perpendicular to a surface of the first substrate, and a [110] crystal direction parallel to the surface of the first substrate.

32. The method of claim 20, wherein the second portion of the epitaxial body is formed to have a vertical side wall.

33. The method of claim 20, wherein the second portion of the epitaxial body is formed to have a slanted side wall and a trapezoid shape.

34. The method of claim 20, wherein the forming of the photoelectric conversion element comprises:
   forming a first impurity region by in situ doping of first impurity in initial and middle stages of the forming of the second portion of the epitaxial body;
   forming a second impurity region by in situ doping of second impurity in a latter stage of the forming of the second portion of the epitaxial body; and
   forming a charge trapping region in top and side surfaces of the second portion of the epitaxial body after the forming of the epitaxial body.

35. The method of claim 34, wherein the first impurity region is formed such that a impurity doping concentration thereof gradually increases from a boundary between the first and second impurity regions toward a boundary between the first impurity region and the transfer gate.

36. The method of claim 34, wherein the charge trapping region is formed by plasma doping (PLAD).

37. The method of claim 34,
   wherein the charge trapping region is formed such that it has the same conductivity type as that of the second impurity region, and
   wherein the charge trapping region is formed such that it has an impurity doping concentration higher than that of the second impurity region.

38. The method of claim 20, wherein the forming of the floating diffusion region comprises:
   reducing a thickness of the first substrate by a thinning process; and
   implanting impurity ions into a surface of the first substrate opposite to the transfer gate.

* * * * *